United States Patent
Wang

(10) Patent No.: US 10,938,618 B2
(45) Date of Patent: Mar. 2, 2021

(54) DEVICE CAPABLE OF COMPENSATING FOR AMPLITUDE-MODULATION TO PHASE MODULATION DISTORTION

(71) Applicant: REALTEK SEMICONDUCTOR CORPORATION, Hsinchu (TW)

(72) Inventor: Wen-Shan Wang, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/682,101

(22) Filed: Nov. 13, 2019

(65) Prior Publication Data

US 2020/0195489 A1 Jun. 18, 2020

(30) Foreign Application Priority Data

Dec. 17, 2018 (TW) .................................. 107145524

(51) Int. Cl.
| | | |
|---|---|---|
| *H04L 27/36* | (2006.01) | |
| *H04L 27/38* | (2006.01) | |
| *H04L 27/34* | (2006.01) | |

(52) U.S. Cl.
CPC ........ *H04L 27/366* (2013.01); *H04L 27/3405* (2013.01); *H04L 27/3818* (2013.01)

(58) Field of Classification Search
CPC .............. H04L 27/366; H04L 27/3818; H04L 27/3405; H03F 2200/378; H03F 2200/03; H03F 3/181; H03F 1/32
USPC .......................................... 375/261, 284, 300
See application file for complete search history.

(56) References Cited

U.S. PATENT DOCUMENTS

| | | |
|---|---|---|
| 5,524,286 A | 6/1996 | Chiesa et al. |
| 6,349,216 B1 | 2/2002 | Alberth, Jr. et al. |
| 7,215,716 B1 * | 5/2007 | Smith ................... H03F 1/3247 375/284 |
| 7,593,491 B1 | 9/2009 | Khlat et al. |

(Continued)

OTHER PUBLICATIONS

OA letter of counterpart TW application of application No. 107145524 dated May 31, 2019. Summary of the OA letter (dated May 31, 2019): Claims 1 and 4 are rejected as being anticipated by the cited reference 1 (U.S. Pat. No. 6,349,216 B1). Claims 3, 5, 8, and 10 are rejected as being unpatentable over the cited reference 1(U.S. Pat. No. 6,349,216 B1).

(Continued)

*Primary Examiner* — Fitwi Y Hailegiorgis
(74) *Attorney, Agent, or Firm* — WPAT, PC

(57) ABSTRACT

Disclosed is a device capable of compensating for amplitude-modulation to phase-modulation distortion. The device includes a transmitter and a controller. The transmitter includes an amplifier circuit, a phase-shift adjustment circuit, and an output circuit. The amplifier circuit is configured to output an amplified signal according to an input signal. The phase-shift adjustment circuit, set between the amplifier circuit and the output circuit, includes at least one of an adjustable capacitor and an adjustable inductor and is configured to adjust the phase shift of the amplified signal according to a control signal. The output circuit is configured to output an output signal according to the amplified signal. The controller is configured to generate the control signal according to the input signal, in which the control signal varies with the input signal.

18 Claims, 13 Drawing Sheets

(56) References Cited

U.S. PATENT DOCUMENTS

2008/0031382 A1* 2/2008 Aoki .................. H03F 3/19
375/300

OTHER PUBLICATIONS

OA letter of counterpart TW application of application No. 107145524 dated Sep. 9, 2019. Summary of the OA letter(dated Sep. 9, 2019): Claims 8 and 10 are rejected as being unpatentable over the cited reference 1 (U.S. Pat. No. 6,349,216 B1) and the cited reference 2 (U.S. Pat. No. 7,593,491 B1).

* cited by examiner

1016

DEVICE CAPABLE OF COMPENSATING FOR AMPLITUDE-MODULATION TO PHASE MODULATION DISTORTION

BACKGROUND OF THE INVENTION

1. Field of the Invention

The present invention relates to a device capable of compensating for distortion, especially to a device capable of compensating for amplitude-modulation to phase-modulation distortion.

2. Description of Related Art

The output of a power amplifier of a wireless transceiver has the problem of amplitude-modulation to phase-modulation distortion (AM-PM distortion). This leads to the problem of spectral regrowth. Spectral regrowth makes it hard to integrate a power amplifier into a wireless transceiver and degrades the performance of a transmitter of the wireless transceiver.

Current techniques for solving the problem of AM-PM distortion include techniques using Cartesian feedback and techniques using adaptive digital predistortion. The techniques using Cartesian feedback need an additional feedback demodulator and an error amplifier and thereby the circuit complexity and cost will increase. Cartesian feedback is found in many textbooks (e.g., Behzad Razavi, "Fundamentals of Microelectronics, $2^{nd}$ Edition", ISBN-10: 9781118156322/ISBN-13: 978-1118156322). The techniques using adaptive digital predistortion may require the increase of bandwidth of baseband signals and thereby lead to much power consumption; additionally, the coupling effect between a frequency up-conversion path and a frequency down-conversion path may degrade the performance of predistortion. An instance of adaptive digital predistortion is found in U.S. Pat. No. 5,524,286.

SUMMARY OF THE INVENTION

An object of the present invention is to provide a device capable of compensating for amplitude-modulation to phase-modulation distortion and preventing the problems of the prior art.

According to an embodiment of the present invention, the device capable of compensating for amplitude-modulation to phase-modulation (AM-PM) distortion includes a transmitter and a controller. The transmitter includes: an amplifier circuit configured to output an amplified signal according to an input signal; a phase-shift adjustment circuit set between the amplifier circuit and an output circuit, the phase-shift adjustment circuit including at least one of an adjustable capacitor and an adjustable inductor and the phase-shift adjustment circuit configured to adjust a phase shift of the amplified signal according to a control signal; and the output circuit configured to output an output signal according to the amplified signal. The controller is configured to generate the control signal according to the input signal, in which the control signal varies with the input signal. This embodiment is applicable to the transmitter of a communication device or an audio transmitter.

According to another embodiment of the present invention, the device capable of compensating for AM-PM distortion includes a receiver and a controller. The receiver includes: an input circuit configured to generate an analog reception signal according to a radio-frequency signal; a phase-shift adjustment circuit coupled to the input circuit and configured to adjust a phase shift of the analog reception signal according to a control signal; and a radio-frequency-to-baseband reception circuit configured to generate a digital reception signal according to the analog reception signal. The controller is configured to generate the control signal according to the digital reception signal, in which the control signal varies with the digital reception signal. This embodiment is applicable to a receiver of a communication device.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a device capable of compensating for amplitude-modulation to phase-modulation distortion (AM-PM distortion). This device is applicable to a transmitter/receiver of a communication device and also applicable to an audio transmitter; however, the application of the device is not limited thereto. The device is easy to be implemented and has the advantages of cost-effectiveness and low power consumption.

Figure 1:
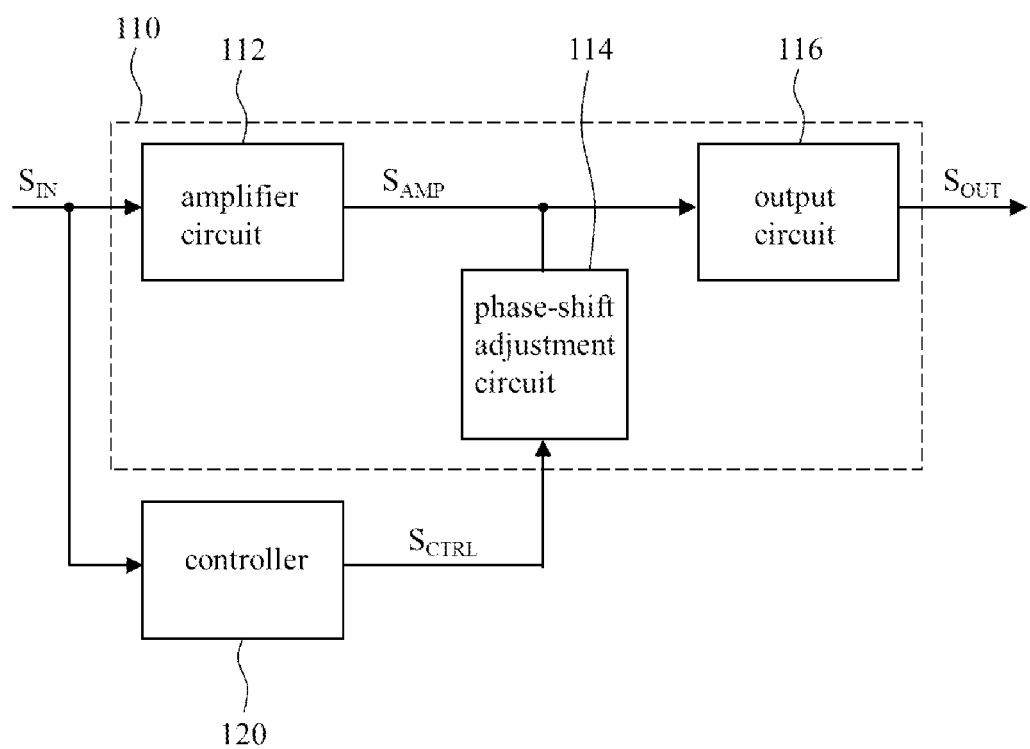
FIG. 1 shows a device capable of compensating for AM-PM distortion according to an embodiment of the present invention.

FIG. 1 shows a device capable of compensating for AM-PM distortion according to an embodiment of the present invention. The device 100 of FIG. 1 includes a transmitter 110 and a controller 120. The transmitter 110 includes an amplifier circuit 112, a phase-shift adjustment circuit 114, and an output circuit 116. The amplifier circuit 112 outputs an amplified signal $S_{AMP}$ according to an input signal $S_{IN}$ which could be a differential or single-ended signal in accordance with the demand for implementation. The input signal $S_{IN}$ is a single signal or composed of a plurality of signals (e.g., an in-phase signal and a quadrature-phase signal). The phase-shift adjustment circuit 114 includes at least one of an adjustable capacitor and an adjustable inductor in light of the application of the device 100. The phase-shift adjustment circuit 114 is coupled to a node between the amplifier circuit 112 and the output circuit 116 and adjusts the phase shift of the amplified signal $S_{AMP}$ according to a control signal $S_{CTRL}$; for instance, the control signal $S_{CTRL}$ is a control voltage controlling a varactor included in the adjustable capacitor of the phase-shift adjustment circuit 114, in which the capacitance of the varactor varies with the control voltage; for another instance, the control signal $S_{CTRL}$ is voltage-levels setting that is obtained with conversion of a digital code and composed of a plurality of voltage-levels, and the voltage-levels are used for respectively controlling a plurality of capacitor paths included in the adjustable capacitor of the phase-shift adjustment circuit 114, in which every capacitor path includes a capacitor component and a switch that is turned on or off according to one of the voltage-levels for the determination of the effective capacitance of the whole adjustable capacitor. The output circuit 116 outputs an output signal $S_{OUT}$ according to the amplified signal $S_{AMP}$. The controller 120 generates the control signal $S_{CTRL}$ according to the input signal $S_{IN}$, and the control signal $S_{CTRL}$ varies with the input signal $S_{IN}$; in other words, as the input signal $S_{IN}$ changes, the control signal $S_{CTRL}$ may also changes, in which the initial relation between the input signal $S_{IN}$ and the control signal $S_{CTRL}$ may be optionally prestored in the controller 120 and optionally updated periodically/nonperiodically.

Figure 2:
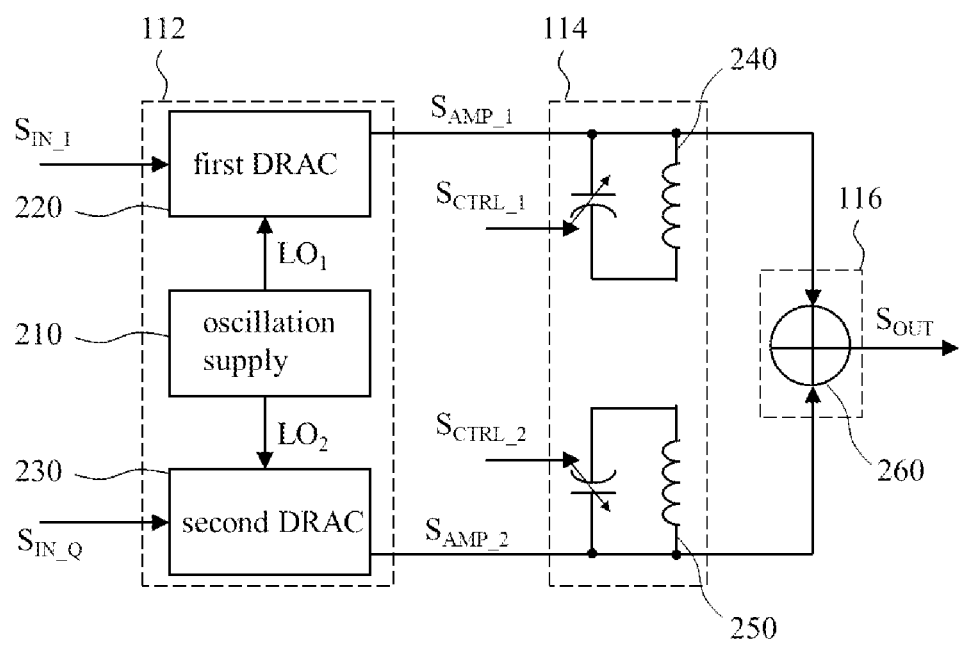
FIG. 2 shows an embodiment of the transmitter of FIG. 1.

FIG. 2 shows an embodiment of the transmitter 110 of FIG. 1. In this embodiment, the transmitter 110 is a wireless transmitter (e.g., a wireless transmitter in compliance with the 802.11a/b/g/n/ac standard, a Bluetooth transmitter, an NBIOT (Narrow Band Internet of Things) transmitter, or the like); the input signal $S_{IN}$ (e.g., a baseband signal) includes an in-phase signal $S_{IN\_I}$ and a quadrature-phase signal $S_{IN\_Q}$; the amplified signal $S_{AMP}$ includes a first amplified signal $S_{AMP\_1}$ and a second amplified signal $S_{AMP\_2}$; and the control signal $S_{CTRL}$ includes a first control signal $S_{CTRL\_1}$ and a second control signal $S_{CTRL\_2}$.

As shown in FIG. 2, the amplifier circuit 112 includes an oscillation supply 210 (e.g., a frequency synthesizer), a first digital-to-radio-frequency amplitude converter (DRAC) 220, and a second DRAC 230. The oscillation supply 210 provides at least one first oscillation signal $LO_1$ (e.g., two oscillation signals having the same frequency $f_{LO}$ but different phases 0°, 180°) and at least one second oscillation signal $LO_2$ (e.g., two oscillation signals having the same frequency $f_{LO}$ but different phases 90°, 270°). The first DRAC 220 converts the in-phase signal $S_{IN\_I}$ into the first amplified signal $S_{AMP\_1}$ according to the at least one first oscillation signal $LO_1$. The second DRAC 230 converts the quadrature-phase signal $S_{IN\_Q}$ into the second amplified signal $S_{AMP\_2}$ according to the at least one second oscillation signal $LO_2$. The detail of the amplifier circuit 112 is found in the following prior art: Morteza S. Alavi, Student Member, IEEE, Robert Bogdan Staszewski, Fellow, IEEE, Leo C. N. de Vreede, Senior Member, IEEE, and John R. Long, Member, IEEE, "A Wideband 2 13-bit All-Digital I/Q RF-DAC", IEEE TRANSACTIONS ON MICROWAVE THEORY AND TECHNIQUES, VOL. 62, NO. 4, April 2014.

As shown in FIG. 2, the phase-shift adjustment circuit 114 includes a first resonant circuit 240 and a second resonant circuit 250. The first resonant circuit 240 adjusts the phase shift of the first amplified signal $S_{AMP\_1}$ according to the first control signal $S_{CTRL\_1}$. The second resonant circuit 250 adjusts the phase shift of the second amplified signal $S_{AMP\_2}$ according to the second control signal $S_{CTRL\_2}$. Each of the first resonant circuit 240 and the second resonant circuit 250 includes a capacitor and an inductor connected in parallel, and the capacitance of the capacitor and/or the inductance of the inductor can be adjusted in accordance with the control signal $S_{CTRL}$.

As shown in FIG. 2, the output circuit 116 includes a signal synthesizer 260 adding up the first amplified signal $S_{AMP\_1}$ and the second amplified signal $S_{AMP\_2}$ and thereby generating the output signal $S_{OUT}$. The signal synthesizer 260 alone is a known or self-developed circuit and its detail is omitted here.

Figure 3:
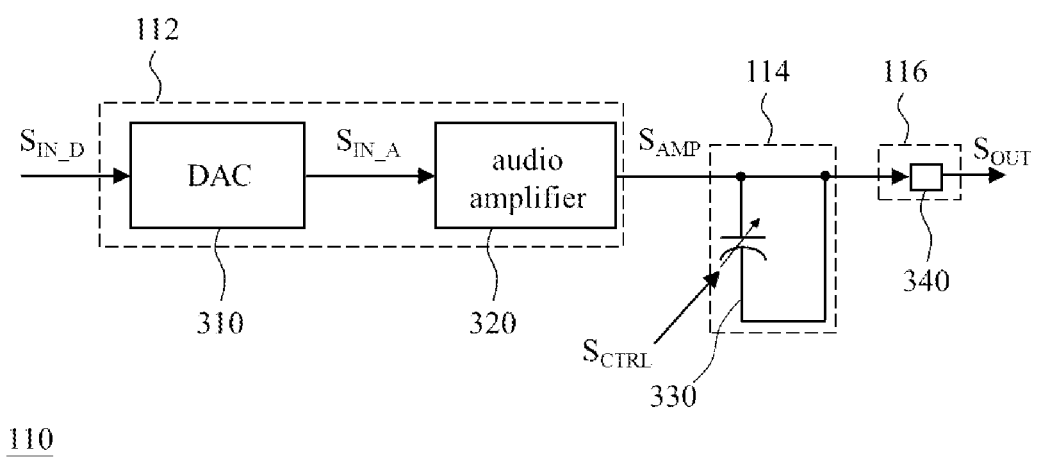
FIG. 3 shows another embodiment of the transmitter of FIG. 1.

FIG. 3 shows another embodiment of the transmitter 110 of FIG. 1. This embodiment is applicable to an audio transmitter. In the embodiment of FIG. 3, the input signal $S_{IN}$ is a digital audio signal $S_{IN\_D}$; the amplifier circuit 112 includes a digital-to-analog converter (DAC) 310 and an audio amplifier 320, in which the DAC 310 generates an analog audio signal $S_{IN\_A}$ according to the digital audio signal $S_{IN\_D}$, and the audio amplifier 320 generates the amplified signal $S_{AMP}$ according to the analog audio signal $S_{IN\_A}$; the phase-shift adjustment circuit 114 includes an adjustable capacitor 330; and the output circuit 116 includes an output pin 340 outputting the output signal $S_{OUT}$ according to the amplified signal $S_{AMP}$.

Figure 4:
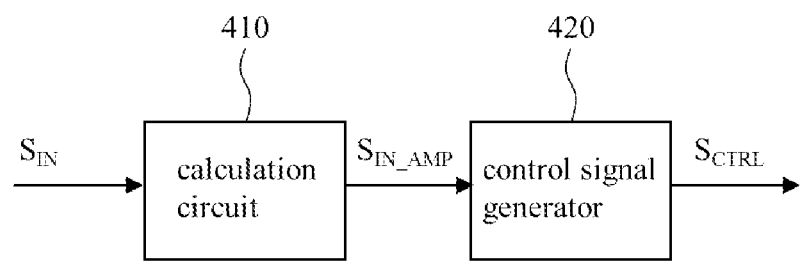
FIG. 4 shows an embodiment of the controller of FIG. 1.

FIG. 4 shows an embodiment of the controller 120 of FIG. 1. The controller 120 of FIG. 4 includes a calculation circuit 410 and a control signal generator 420. The calculation circuit 410 outputs a calculation value $S_{IN\_AMP}$ according to the input signal $S_{IN}$ (e.g., the aforementioned in-phase signal $S_{IN\_1}$ and the quadrature-phase signal $S_{IN\_Q}$) to the control signal generator 420, in which the calculation value (e.g., $\sqrt{S_{IN_I}^2 + S_{IN_Q}^2}$) is related to the amplitude of the input signal. The control signal generator 420 determines the strength of the control signal $S_{CTRL}$ (e.g., the strength of a control voltage) or the voltage-levels setting of the control signal $S_{CTRL}$ (e.g., voltage-levels setting obtained with the conversion of the calculation value $S_{IN\_AMP}$ and composed of a plurality of voltage-levels, in which each voltage-level is used for turning on or off a switch) according to the calculation value $S_{IN\_AMP}$, and the control signal generator 420 outputs the control signal $S_{CTRL}$ to the phase-shift adjustment circuit 114. It should be noted that if the input signal $S_{IN}$ is a single signal (e.g., the digital audio signal $S_{IN\_D}$ of FIG. 3) and the amplitude of the single signal can be determined directly, the calculation circuit 410 can be optionally omitted; in this case, the control signal generator 420 determines the strength of the control signal $S_{CTRL}$ or the voltage-levels setting of the control signal $S_{CTRL}$ in accordance with the amplitude of the input signal $S_{IN}$ directly.

Figure 5:
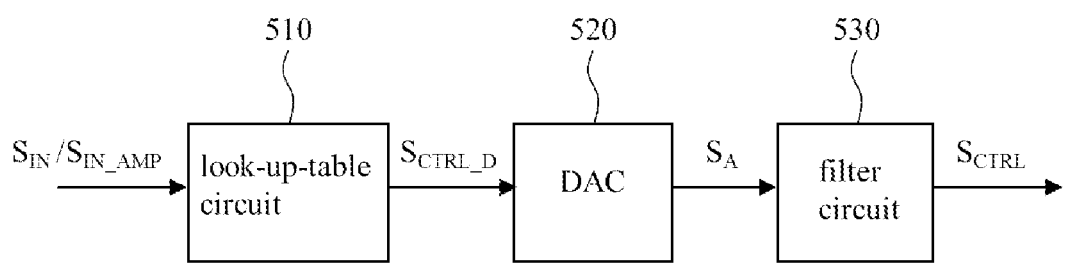
FIG. 5 shows an embodiment of the control signal generator of FIG. 4.

FIG. 5 shows an embodiment of the control signal generator 420 of FIG. 4. The control signal generator 420 of FIG. 5 includes a look-up-table circuit 510, a digital-to-analog converter (DAC) 520, and a filter circuit 530, each of which is a known or self-developed circuit. The look-up-table circuit 510 outputs a digital control signal $S_{CTRL\_D}$ according to the input signal $S_{IN}$, and the relation between the input signal $S_{IN}$ and the digital control signal $S_{CTRL\_D}$ is prestored in the look-up-table circuit 510 or a storage circuit accessible to the look-up-table circuit 510. The DAC 520 generates an analog signal $S_A$ according to the digital control signal $S_{CTRL\_D}$. The filter circuit 430 (e.g., a low pass filter) generates a filtered signal as the control signal $S_{CTRL}$ according to the analog signal $S_A$. It should be noted that if there is no need to filter the analog signal $S_A$, the filter circuit 530 can be optionally omitted; in this case, the analog signal $S_A$ is treated as the control signal $S_{CTRL}$.

Figure 6:
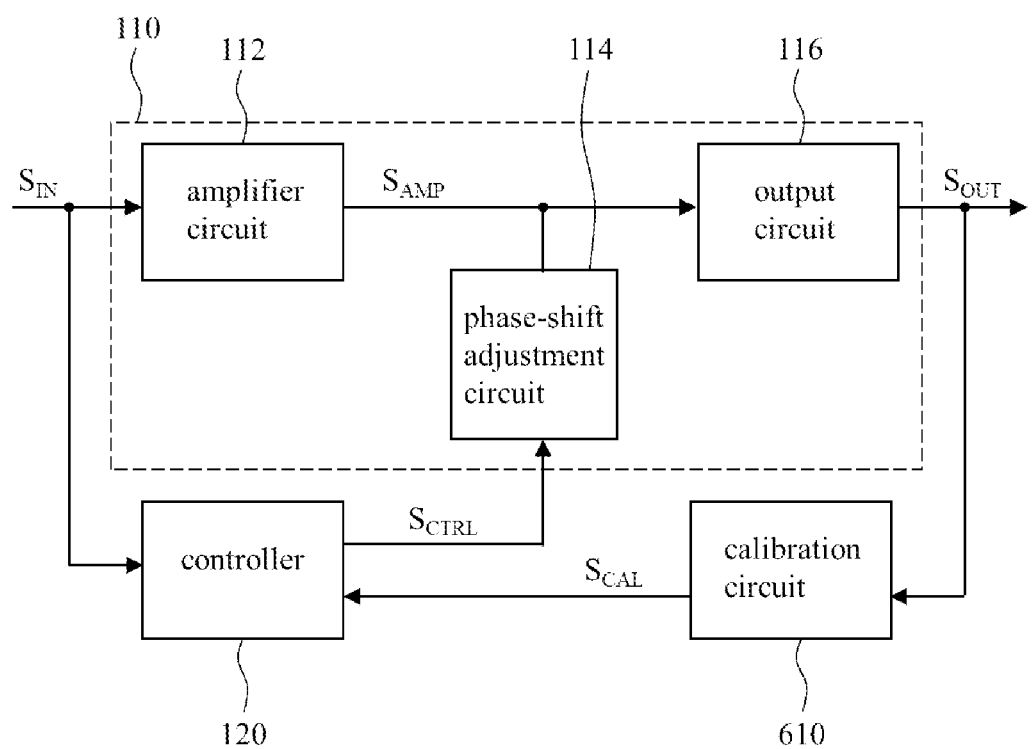
FIG. 6 shows a device capable of compensating for AM-PM distortion according to another embodiment of the present invention.
Figure 7:
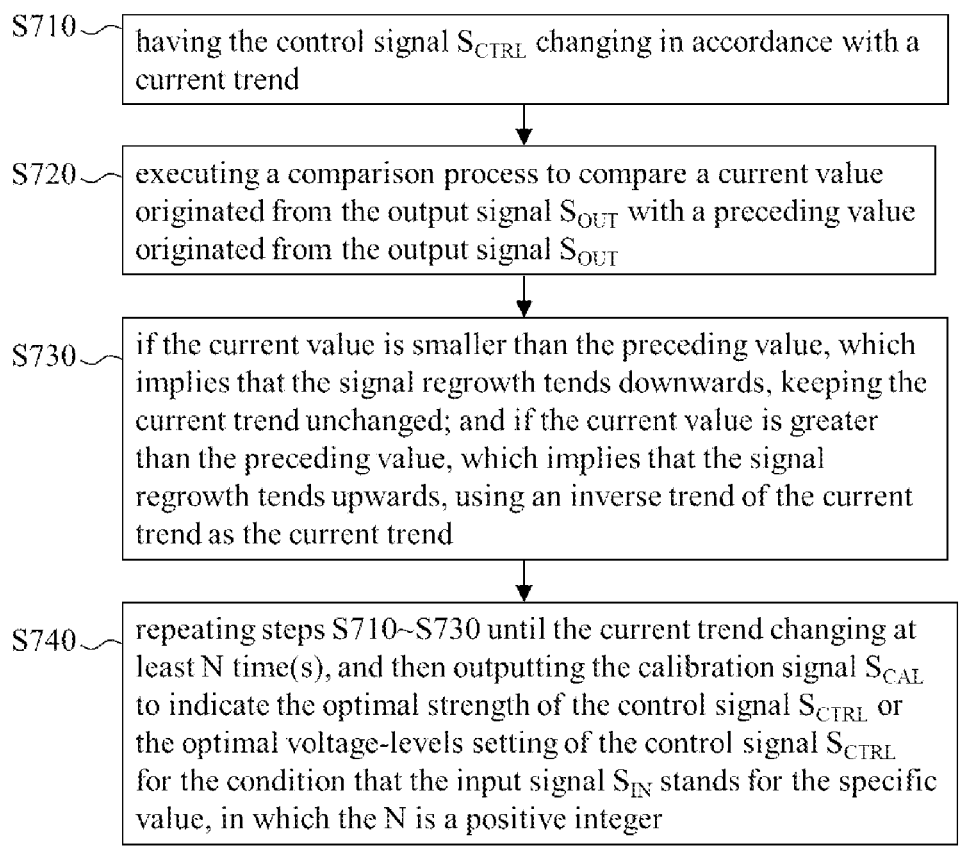
FIG. 7 shows the steps executed by the calibration circuit of FIG. 6.

FIG. 6 shows a device capable of compensating for AM-PM distortion according to another embodiment of the present invention. In comparison with FIG. 1, the device 600 of FIG. 6 further includes a calibration circuit 610. The calibration circuit outputs a calibration signal $S_{CAL}$ to the controller 120 according to the relation between the change of the control signal $S_{CTRL}$ and the variation of the output signal $S_{OUT}$ so as to allow the controller 120 to determine the relation between the input signal $S_{IN}$ and the control signal $S_{CTRL}$ according to the calibration signal $S_{CAL}$. In an exemplary implementation, when the input signal $S_{IN}$ stands for a specific value (e.g., when the amplitude of the input signal $S_{IN}$ is a specific amplitude), the calibration circuit 610 executes at least the following steps as shown in FIG. 7 to determine the relation between the change of the control signal $S_{CTRL}$ and the variation of the input signal $S_{IN}$:

step S710: having the control signal $S_{CTRL}$ changing in accordance with a current trend. For instance, the control signal $S_{CTRL}$ is a control voltage; step S710 has the control voltage increase by a predetermined voltage when the current trend is a rising trend, and has the control voltage decrease by the predetermined voltage when the current trend is a falling trend. For another instance, the control signal $S_{CTRL}$ is setting of voltage-levels (e.g., 00011 or 00111 that are used for respectively controlling five switches of the aforementioned capacitor paths, in which level "0" is used for turning off a switch while level "1" is used for turning on a switch); step S710 changes at least one voltage-level of the control signal $S_{CTRL}$ (e.g., 00011→00111 due to a rising trend, or 00111→00011 due to a falling trend).

step S720: executing a comparison process to compare a current value (e.g., the digital feedback signal $S_{FEEDBACK}$ mentioned in the later paragraph) originated from the output signal $S_{OUT}$ with a preceding value (e.g., the preceding digital feedback signal mentioned in the later paragraph) originated from the output signal $S_{OUT}$. The current value is generated after the latest change of the control signal $S_{CTRL}$ while the preceding value is generated before the latest change of the control signal $S_{CTRL}$.

step S730: if the current value is smaller than the preceding value, which implies that the signal regrowth tends downwards, keeping the current trend unchanged; and if the current value is greater than the preceding value, which implies that the signal regrowth tends upwards, using an inverse trend of the current trend as the current trend.

step S740: repeating steps S710-S730 till the current trend changing at least N time(s), and then outputting the calibration signal $S_{CAL}$ to indicate the optimal strength of the control signal $S_{CTRL}$ or the optimal voltage-levels setting of the control signal $S_{CTRL}$ for the condition that the input signal $S_{IN}$ stands for the specific value, in which the N is a positive integer. For instance, if the current value is smaller than the preceding value when executing the comparison process for the first time, it indicates that the default trend for the control signal $S_{CTRL}$ is correct and thus the N can be one or more; but if the current value is greater than the preceding value when executing the comparison process for the first time, it indicates that the default trend for the control signal $S_{CTRL}$ is incorrect and thus the N should be two or more.

With the aforementioned steps, the calibration circuit 610 can find out the optimal strength or voltage-levels setting of the control signal $S_{CTRL}$ for each value of the input signal $S_{IN}$.

Figure 8:
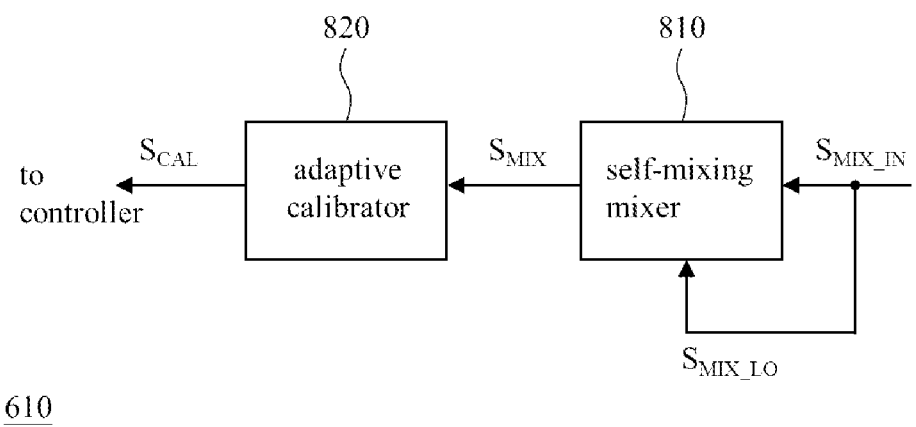
FIG. 8 shows an embodiment of the calibration circuit of FIG. 6.

FIG. 8 shows an embodiment of the calibration circuit 610 of FIG. 6. As shown in FIG. 8, the calibration circuit 610 includes a self-mixing mixer 810 and an adaptive calibrator 820. The self-mixing mixer 810 generates a mixing signal $S_{MIX}$ according to the output signal $S_{OUT}$ or the derivative signal thereof, in which the output signal $S_{OUT}$ (or its derivative signal) is treated as a mixer input signal $S_{MIX\_IN}$ and a mixer oscillation signal $S_{MIX\_LP}$ so that the self-mixing mixer 810 can generate the mixing signal $S_{MIX}$ accordingly. The mixing signal $S_{MIX}$ includes a regrowth signal (e.g., a signal of the frequency $2f_{BB}$, in which $f_{BB}$ is the frequency of the input signal $S_{IN}$). The adaptive calibrator 820 outputs the calibration signal $S_{CAL}$ to the controller 120 according to the relation between the change of the control signal $S_{CTRL}$ and the variation of the mixing signal $S_{MIX}$. For instance, when the control signal $S_{CTRL}$ increases by a predetermined unit (e.g., a predetermined voltage or a predetermined amount of changed voltage-level(s)), if a current value originated from the mixing signal $S_{MIX}$ is smaller than a preceding value that is generated before the increase of the control signal $S_{CTRL}$ and originated from the mixing signal $S_{MIX}$, the adaptive calibrator 820 outputs the calibration signal $S_{CAL}$ to have the control signal $S_{CTRL}$ increase by one predetermined unit again; but if the current value is greater than the preceding value, the adaptive calibrator 820 outputs the calibration signal $S_{CAL}$ to have the control signal $S_{CTRL}$ decrease by one predetermined unit. It should be noted that in order to ensure the output signal $S_{OUT}$ is suitable for/ acceptable to the calibration circuit 610, the calibration circuit 610 may optionally include a resistor (e.g., an adjustable resistor) (not shown in the figures); this resistor is used for outputting a voltage-reduced signal as the derivative signal of the output signal $S_{OUT}$ so that the self-mixing mixer 810 outputs the mixing signal $S_{MIX}$ according to the voltage-reduced signal.

Figure 9A:
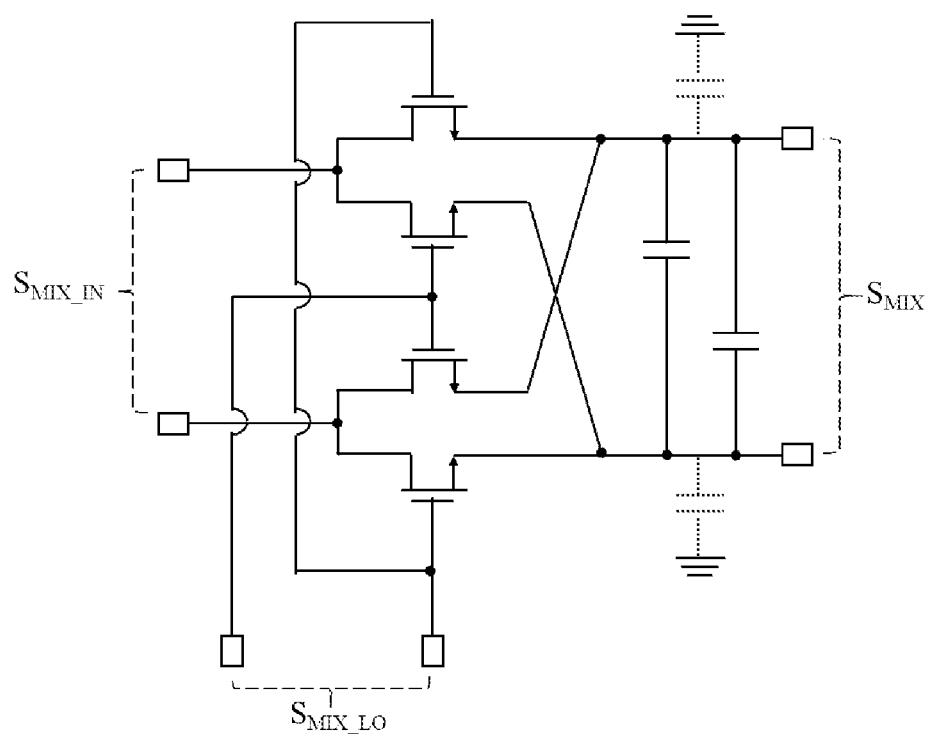
FIG. 9a shows an embodiment of the self-mixing mixer of FIG. 8.

FIG. 9a shows an embodiment of the self-mixing mixer 810 of FIG. 8; and the dotted lines in FIG. 9a stands for parasitic capacitors. Since every component in FIG. 9a is well known in this technical field, people of ordinary skill in the art can appreciate the operation of the self-mixing mixer 810 according to the disclosure of FIG. 9a.

Figure 9B:
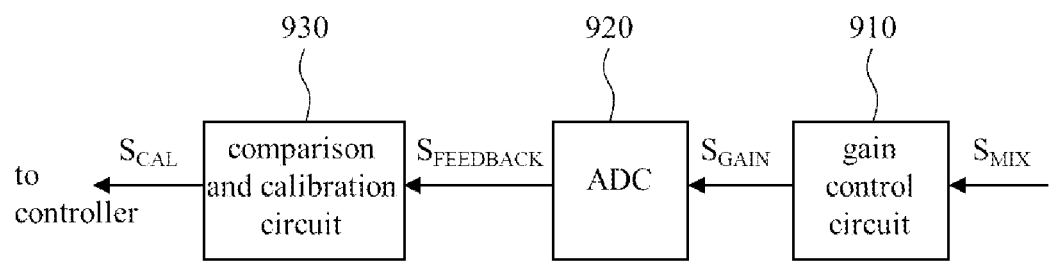
FIG. 9b shows an embodiment of the adaptive calibrator of FIG. 8.

FIG. 9b shows an embodiment of the adaptive calibrator 820 of FIG. 8. As shown in FIG. 9b, the adaptive calibrator 820 includes a gain control circuit 910, an analog-to-digital converter (ADC) 920, and a comparison and calibration circuit 930, each of which can be realized with a known or self-developed circuit. The gain control circuit 910 (e.g., a variable gain amplifier (VGA)) is configured to generate a gain control signal $S_{GAIN}$ according to the mixing signal $S_{MIX}$. The ADC 920 is configured to generate a digital feedback signal $S_{FEEDBACK}$ according to the gain control signal $S_{GAIN}$. The comparison and calibration circuit 930 is configured to compare the digital feedback signal $S_{FEEDBACK}$ with a preceding digital feedback signal (i.e., the digital feedback signal $S_{FEEDBACK}$ generated last time) to determine and output the calibration signal $S_{CAL}$. After finishing comparing the digital feedback signal $S_{FEEDBACK}$ with the preceding digital feedback signal, the comparison and calibration circuit 930 treats the digital feedback signal $S_{FEEDBACK}$ as the preceding digital feedback signal for the next round of comparison. In an exemplary implementation, the comparison and calibration circuit 930 is used for executing the steps of FIG. 7.

Figure 10:
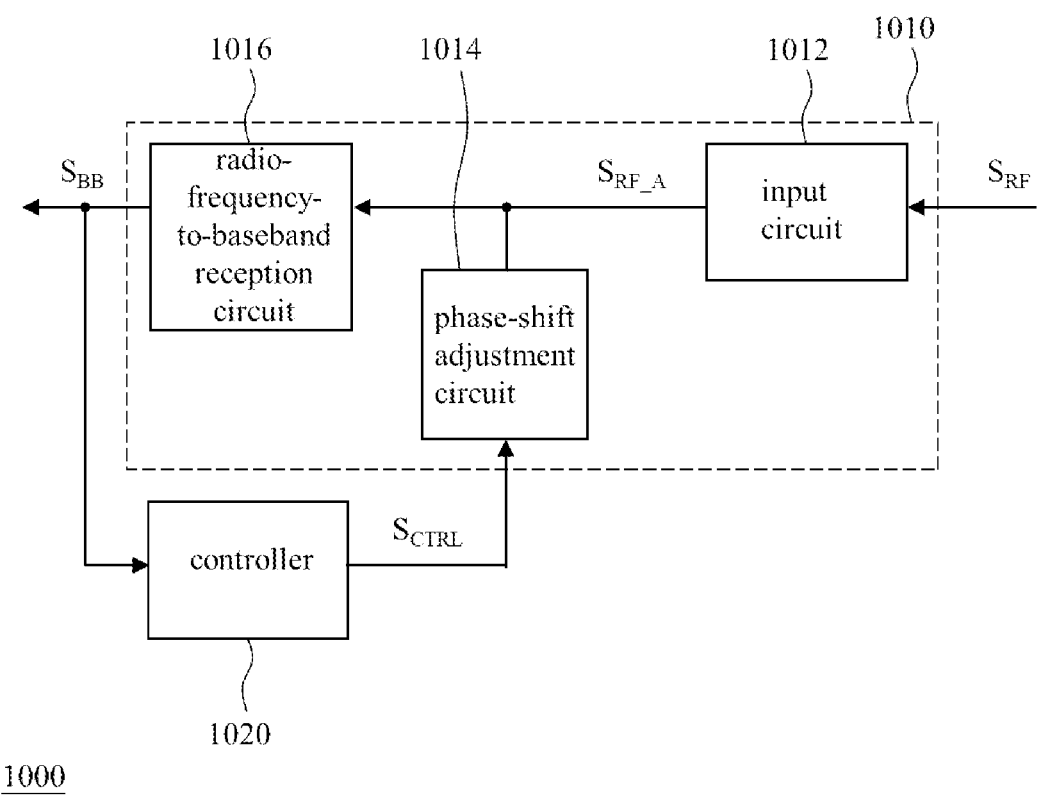
FIG. 10 shows a device capable of compensating for AM-PM distortion according to yet another embodiment of the present invention.

FIG. 10 shows a device capable of compensating for AM-PM distortion according to yet another embodiment of the present invention. The device 1000 of FIG. 10 includes a receiver 1010 (e.g., a wireless receiver in compliance with the 802.11a/b/g/n/ac standard, a Bluetooth receiver, an NBIOT (Narrow Band Internet of Things) receiver, or the like) and a controller 1020 (e.g., the controller 120 of FIG. 4). The receiver 1010 includes an input circuit 1012, a phase-shift adjustment circuit 1014 (e.g., an adjustable capacitor), and a radio-frequency-to-baseband reception circuit 1016. The input circuit 1020 (e.g., an adjustable resistor or a pin) outputs an analog reception signal $S_{RF\_A}$ according to a radio-frequency (RF) signal $S_{RF}$. The phase-shift adjustment circuit 1014 is coupled to the input circuit 1012 and adjusts the phase shift of the analog reception signal $S_{RF\_A}$. The radio-frequency-to-baseband reception circuit 1016 generates a digital reception signal $S_{BB}$ according to the analog reception signal $S_{RF\_A}$. The controller 1020 generates the control signal $S_{CTRL}$ according to the digital reception signal $S_{BB}$, in which the control signal $S_{CTRL}$ varies with the digital reception signal $S_{BB}$.

Figure 11:
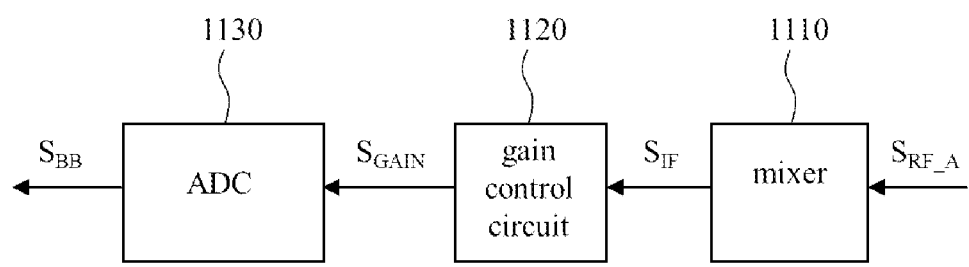
FIG. 11 shows an embodiment of the RF-to-baseband reception circuit of FIG. 10.

FIG. 11 shows an embodiment of the radio-frequency-to-baseband reception circuit 1016 of FIG. 10. The radio-frequency-to-baseband reception circuit 1016 of FIG. 11 includes a mixer 1110, a gain control circuit 1120, and an analog-to-digital converter (ADC) 1130. The mixer 1110 generates an intermediate-frequency signal $S_{IF}$ according to the analog reception signal $S_{RF\_A}$. The gain control circuit 1120 (e.g., an adjustable gain control circuit) generates a gain control signal $S_{GAIN}$ according to the intermediate-frequency signal $S_{IF}$. The ADC 1130 generates the digital reception signal $S_{BB}$ according to the gain control signal $S_{GAIN}$.

Figure 12:
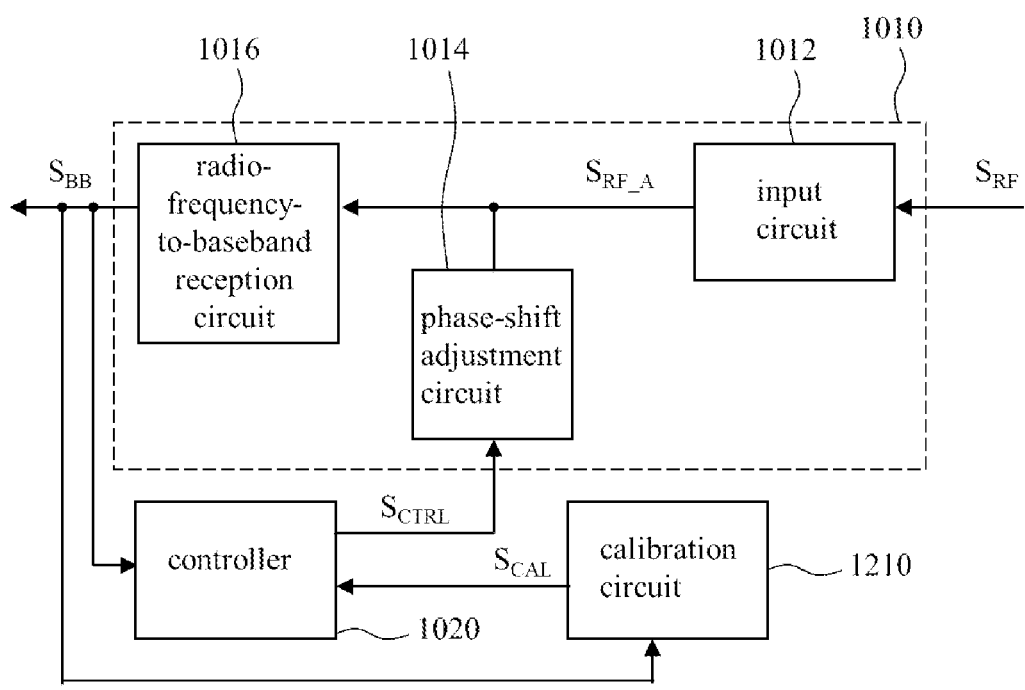
FIG. 12 shows a device capable of compensating for AM-PM distortion according to a further embodiment of the present invention.

FIG. 12 shows a device capable of compensating for AM-PM distortion according to a further embodiment of the present invention. In comparison with FIG. 10, the device 1200 of FIG. 12 further includes a calibration circuit 1210 (e.g., the comparison and calibration circuit 930 of FIG. 9b). The calibration circuit 1210 outputs a calibration signal $S_{CAL}$ to the controller 1020 according to the relation between the variation of the digital reception signal $S_{BB}$ and the change of the control signal $S_{CTRL}$ so as to allow the controller 1020 to determine the relation between the digital reception signal $S_{BB}$ and the control signal $S_{CTRL}$ according to the calibration signal $S_{CAL}$. In an exemplary implementation, the calibration circuit 1210 executes the steps of FIG. 7 except that the input signal $S_{IN}$ is replaced by the radio-frequency signal $S_{RF}$, the specific value of the input signal $S_{IN}$ is replaced by the specific amplitude of the radio-frequency signal $S_{RF}$, and the output signal $S_{OUT}$ is replaced by the digital reception signal $S_{BB}$.

Since those of ordinary skill in the art can appreciate the detail and modification of the embodiments of FIGS. 10~12 by referring to the disclosure of the embodiments of FIGS. 1~9b, repeated and redundant description is omitted here.

To sum up, in comparison with the prior art, the AM-PM distortion compensation device of the present invention is easy to be implemented and has the advantages of cost-effectiveness and low power consumption.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A device capable of compensating for amplitude-modulation to phase-modulation (AM-PM) distortion, comprising:
 a transmitter, including:
  an amplifier circuit configured to output an amplified signal according to an input signal;
  a phase-shift adjustment circuit set between the amplifier circuit and an output circuit, the phase-shift adjustment circuit including at least one of an adjustable capacitor and an adjustable inductor and configured to adjust a phase shift of the amplified signal according to a control signal; and
  the output circuit configured to output an output signal according to the amplified signal; and
 a controller configured to generate the control signal according to the input signal, in which the control signal varies with the input signal,
 wherein the transmitter is a wireless signal transmitter, the input signal includes an in-phase signal and a quadrature-phase signal, the amplified signal includes a first amplified signal and a second amplified signal, the control signal includes a first control signal and a second control signal, the output signal includes a first output signal and a second output signal, the amplifier circuit includes:
  an oscillation supply configured to provide at least one first oscillation signal and at least one second oscillation signal;
  a first digital-to-radio-frequency amplitude converter (DRAC) configured to convert the in-phase signal into the first amplified signal according to the at least one first oscillation signal; and
  a second digital-to-radio-frequency amplitude converter configured to convert the quadrature-phase signal into the second amplified signal according to the at least one second oscillation signal;
 the phase-shift adjustment circuit includes:
  a first resonant circuit configured to adjust a phase shift of the first amplified signal according to the first control signal; and
  a second resonant circuit configured to adjust a phase shift of the second amplified signal according to the second control signal; and
 the output circuit includes:
  a signal synthesizer configured to add up the first amplified signal and the second amplified signal and thereby generate the output signal.

2. The device capable of compensating for AM-PM distortion of claim 1, wherein the transmitter is an audio transmitter, the input signal is a digital audio signal, the amplifier circuit includes:
 a digital-to-analog converter configured to generate an analog audio signal according to the digital audio signal; and
 an audio amplifier configured to generate the amplified signal according to the analog audio signal; and
 the output circuit includes:
  an output pin used for outputting the output signal according to the amplified signal.

3. The device capable of compensating for AM-PM distortion of claim 1, where the phase-shift adjustment circuit includes a varactor as the adjustable capacitor, the control signal includes a control voltage, and capacitance of the varactor varies with the control voltage.

4. The device capable of compensating for AM-PM distortion of claim 1, wherein the phase-shift adjustment circuit includes the adjustable capacitor including a plurality of capacitor paths that are connected in parallel, each of the capacitor paths includes a capacitor component and a switch, and each of the switches of the capacitor paths is turned on or off according to the control signal for determination of capacitance of the adjustable capacitor.

5. The device capable of compensating for AM-PM distortion of claim 1, wherein the controller includes:
a control signal generator configured to determine strength of the control signal or voltage-levels setting of the control signal according to an amplitude of the input signal, and thereby output the control signal to the phase-shift adjustment circuit.

6. The device capable of compensating for AM-PM distortion of claim 5, wherein the control signal generator includes:
a look-up-table circuit configured to output a digital control signal according to the amplitude of the input signal; and
a digital-to-analog converter configured to generate an analog signal according to the digital control signal, in which the analog signal or a filtered signal of the analog signal is treated as the control signal.

7. The device capable of compensating for AM-PM distortion of claim 5, wherein the controller further includes:
a calculation circuit configured to provide a calculation value for the control signal generator according to the input signal, in which the calculation value is related to the amplitude of the input signal.

8. A device capable of compensating for amplitude-modulation to phase-modulation (AM-PM) distortion, comprising:
a transmitter, including:
an amplifier circuit configured to output an amplified signal according to an input signal;
a phase-shift adjustment circuit set between the amplifier circuit and an output circuit, the phase-shift adjustment circuit including at least one of an adjustable capacitor and an adjustable inductor and configured to adjust a phase shift of the amplified signal according to a control signal; and
the output circuit configured to output an output signal according to the amplified signal;
a controller configured to generate the control signal according to the input signal, in which the control signal varies with the input signal; and
a calibration circuit configured to output a calibration signal to the controller according to a relation between change of the control signal and variation of the output signal so that the controller determines a relation between the input signal and the control signal according to the calibration signal.

9. The device capable of compensating for AM-PM distortion of claim 8, wherein the calibration circuit includes:
a self-mixing mixer configured to generate a mixing signal according to the output signal or a derivative signal of the output signal; and
an adaptive calibrator configured to output the calibration signal to the controller according to the relation between the change of the control signal and the variation of the mixing signal.

10. The device capable of compensating for AM-PM distortion of claim 9, wherein the calibration circuit further includes a resistor configured to output a voltage-reduced signal as the derivative signal of the output signal in accordance with the output signal so that the self-mixing mixer generates the mixing signal according to the voltage-reduced signal.

11. The device capable of compensating for AM-PM distortion of claim 9, wherein the output signal or the derivative signal is treated as a mixer input signal and a mixer oscillation signal concurrently so that the self-mixing mixer generates the mixing signal according to the mixer input signal and the mixer oscillation signal.

12. The device capable of compensating for AM-PM distortion of claim 9, wherein the adaptive calibrator includes:
a gain control circuit configured to generate a gain control signal according to the mixing signal;
an analog-to-digital converter configured to generate a digital feedback signal according to the gain control signal; and
a comparison and calibration circuit configured to compare the digital feedback signal with a preceding digital feedback signal and thereby determine and output the calibration signal.

13. The device capable of compensating for AM-PM distortion of claim 8, wherein in a condition that the input signal stands for a specific value, the calibration circuit carries out at least following steps in order to determine the relation between the change of the control signal and the variation of the output signal:
having the control signal changing in accordance with a current trend;
executing a comparison process to compare a current value originated from the output signal with a preceding value originated from the output signal, in which the current value is generated after a latest change of the control signal while the preceding value is generated before the latest change of the control signal;
if the current value is smaller than the preceding value, keeping the current trend unchanged, and if the current value is greater than the preceding value, updating the current trend by using an inverse trend of the current trend as the current trend; and
repeating above steps till the current trend changing at least N time(s), and then outputting the calibration signal to indicate optimal strength of the control signal or optimal voltage-levels setting of the control signal for the condition that the input signal stands for the specific value, in which the N is a positive integer.

14. A device capable of compensating for amplitude-modulation to phase-modulation (AM-PM) distortion, comprising:
a receiver including:
an input circuit configured to generate an analog reception signal according to a radio-frequency signal;
a phase-shift adjustment circuit coupled to the input circuit and configured to adjust a phase shift of the analog reception signal according to a control signal; and
a radio-frequency-to-baseband reception circuit configured to generate a digital reception signal according to the analog reception signal;
a controller configured to generate the control signal according to the digital reception signal, in which the control signal varies with the digital reception signal; and
a calibration circuit configured to output a calibration signal to the controller in accordance with a relation between variation of the digital reception signal and change of the control signal so that the controller determines a relation between the digital reception signal and the control signal according to the calibration signal.

15. The device capable of compensating for AM-PM distortion of claim 14, wherein the radio-frequency-to-baseband reception circuit includes:
a mixer configured to generate an intermediate-frequency signal according to the analog reception signal;
a gain control circuit configured to generate a gain control signal according to the intermediate-frequency signal; and
an analog-to-digital converter configured to generate the digital reception signal according to the gain control signal.

16. The device capable of compensating for AM-PM distortion of claim 14, wherein the controller includes:
a control signal generator configured to determine strength of the control signal or voltage-levels setting of the control signal according to an amplitude of the digital reception signal, and thereby output the control signal to the phase-shift adjustment circuit.

17. The device capable of compensating for AM-PM distortion of claim 16, wherein the control signal generator includes:
a calculation circuit configured to generate a calculation value according to the digital reception signal, in which the calculation value is related to the amplitude of the digital reception signal;
a look-up-table circuit configured to output a digital control signal according to the calculation value; and
a digital-to-analog converter configured to generate an analog signal according to the digital control signal, in which the analog signal or a filtered signal of the analog signal is treated as the control signal.

18. The device capable of compensating for AM-PM distortion of claim 14, wherein in a condition that an amplitude of the radio-frequency signal is a specific amplitude, the calibration circuit carries out at least following steps in order to determine the relation between the variation of the digital reception signal and the change of the control signal:
having the control signal changing in accordance with a current trend;
executing a comparison process to compare a current value of the digital reception signal with a preceding value of the digital reception signal, in which the current value is generated after a latest change of the control signal while the preceding value is generated before the latest change of the control signal;
if the current value is smaller than the preceding value, keeping the current trend unchanged, and if the current value is greater than the preceding value, updating the current trend by using an inverse trend of the current trend as the current trend; and
repeating above steps till the current trend changing at least N time(s), and then outputting the calibration signal to indicate optimal strength of the control signal or optimal voltage-levels setting of the control signal for the condition that the amplitude of the radio-frequency signal is the specific amplitude, in which the N is a positive integer.

* * * * *